(12) United States Patent
Liu

(10) Patent No.: US 8,421,264 B2
(45) Date of Patent: Apr. 16, 2013

(54) WIND POWER GENERATION DEVICE FOR ELECTRONIC EQUIPMENT

(75) Inventor: Jian-Yan Liu, Hsin Chuan (TW)

(73) Assignee: Asia Vital Components Co., Ltd., Taipei County (TW)

( * ) Notice: Subject to any disclaimer, the term of this patent is extended or adjusted under 35 U.S.C. 154(b) by 359 days.

(21) Appl. No.: 12/945,881

(22) Filed: Nov. 14, 2010

(65) Prior Publication Data

US 2012/0119498 A1    May 17, 2012

(51) Int. Cl.
*F03B 13/00* (2006.01)
(52) U.S. Cl.
USPC ............................................................. 290/55
(58) Field of Classification Search ............. 290/55
See application file for complete search history.

(56) References Cited

U.S. PATENT DOCUMENTS

| | | | |
|---|---|---|---|
| 6,676,122 B1 * | 1/2004 | Wobben | 290/55 |
| 6,703,718 B2 * | 3/2004 | Calley et al. | 290/44 |
| 6,856,037 B2 * | 2/2005 | Yazawa et al. | 290/43 |
| 7,443,066 B2 * | 10/2008 | Salamah et al. | 310/64 |
| 7,482,707 B2 * | 1/2009 | Wobben | 290/44 |
| 7,780,320 B2 * | 8/2010 | Hu et al. | 362/431 |
| 7,796,389 B2 * | 9/2010 | Edmunds et al. | 361/700 |
| 8,319,362 B2 * | 11/2012 | Vihriala et al. | 290/44 |
| 2007/0222223 A1 * | 9/2007 | Bagepalli et al. | 290/55 |
| 2009/0045628 A1 * | 2/2009 | Erdman et al. | 290/44 |
| 2010/0117362 A1 * | 5/2010 | Vihriala et al. | 290/52 |
| 2011/0103011 A1 * | 5/2011 | Koplow | 361/679.54 |
| 2012/0156053 A1 * | 6/2012 | Stiesdal | 416/93 R |
| 2012/0192574 A1 * | 8/2012 | Ghoshal et al. | 62/3.2 |

FOREIGN PATENT DOCUMENTS

WO    WO 2008131766 A2 * 11/2008

* cited by examiner

*Primary Examiner* — Joseph Waks

(57) ABSTRACT

A wind power generation device for electronic equipment including: at least a heat dissipation module, a wind power generation module, and at least a reception module. The heat dissipation module includes a heat dissipation device with a plurality of heat dissipating fins, and a first fan butted with one side of the heat dissipation device. Butted with the other side of the heat dissipation device in opposition to the first fan, the wind power generation module is driven to operate, generate electricity, and produce a power signal under the propulsion of the fluid generated by the first fan. The reception module is electrically interconnected with the wind power generation module and receives the power signal. The combination of a heat dissipation module, a wind power generation module, and a reception module effectively saves energy by utilizing or recycling the fluid generated by the first fan, converting the fluid into usable energy, and supplying the energy to the reception module for use or storage.

17 Claims, 11 Drawing Sheets

WIND POWER GENERATION DEVICE FOR ELECTRONIC EQUIPMENT

BACKGROUND OF THE INVENTION

1. Field of the Invention

The present invention relates to a wind power generation device for electronic equipment, and particularly to an energy-saving wind power generation device for electronic equipment, wherein a combination of a heat dissipation module, a wind power generation module, and a reception module effectively utilizes or recycles the fluid generated by the first fan of the heat dissipation module, converts the fluid into usable energy (such as power supply), and supplies the energy to the reception module for use or storage.

2. Brief Description of the Related Art

Two kinds of heat dissipation methods are presently available for electronic products. In the first method a fan is disposed inside the electronic product (such as computer casing) to dissipate heat by emitting the waste heat generated therein to the outside. In the second method a heat dissipation module is usually disposed on a heating element (such as central processing unit) to dissipate the heat generated when the central processing unit is operating.

The heat dissipation module comprises a fan and a heat dissipation device, wherein the fan is locked on top of the heat dissipation device, which is disposed on top of the central processing unit. On the one hand, the heat generated when the central processing unit is operating is dissipated by the heat dissipation device. On the other hand, the wind generated by the revolving fan flows to the heat dissipation device and continuously blows heat away from the heat dissipation device to prevent the central processing unit from overheating and the resultant reduction of work efficiency.

However, existing fans force heat dissipation by guiding fluid to the heating element or emit interior waste heat to the outside without being capable of utilizing or recycling the fluid generated by the fan, for example converting the fluid into usable electric energy for other electronic components or the fan to save energy. Therefore, this is an issue that still challenges the industry. In view of the foregoing considerations, existing heat dissipation methods have the following disadvantages:

1. They fail to save energy;
2. They fail to utilize or recycle the fluid generated by fans.

The present invention attempts to solve the foregoing problems and improve the foregoing disadvantages.

SUMMARY OF THE INVENTION

In order to overcome the deficiencies of the preceding prior art, it is an object of the present invention to provide an energy-saving wind power generation device for electronic equipment which combines a heat dissipation module, a wind power generation module, and a reception module.

It is a further object of the present invention to provide a wind power generation device for electronic equipment which effectively utilizes or recycles the fluid generated by the first fan, converts the fluid into usable energy (such as power supply), and supplies the energy to the reception module for use or storage.

With the above objects in mind, the present invention provides a wind power generation device for electronic equipment comprising at least a heat dissipation module, a wind power generation module, and at least a reception module. The heat dissipation module includes a heat dissipation device with a plurality of heat dissipating fins and a first fan butted to one side of the heat dissipation device. The wind power generation module is butted to the other side of the heat dissipation device in opposition to the first fan. Propelled by the fluid generated by the first fan, the wind power generation module operates and generates electricity, producing a power signal. The reception module is electrically interconnected with the wind power generation module and is used to receive the power signal. The present invention's combination of a heat dissipation module, a wind power generation module, and a reception module effectively saves energy by utilizing or recycling the fluid generated by the first fan, converting the fluid into usable energy (such as power supply), and supplying the energy to the reception module for use or storage.

The present invention also provides a second wind power generation device for electronic equipment comprising at least a heat dissipation module, a wind power generation module, and at least a reception module. The heat dissipation module includes a heat dissipation device with a plurality of heat dissipating fins and a first fan butted to one side of the heat dissipation device. The wind power generation module includes a wind power machine set and a generating unit. The wind power machine set is connected to the generating unit and disposed on the other side of the heat dissipation device. Propelled by the fluid generated by the first fan, the wind power machine set operates and generates electricity, producing a power signal. The reception module is electrically interconnected with power generation module and is used to receive the power signal. The present invention's combination of a heat dissipation module, a wind power generation module, and a reception module effectively saves energy by utilizing or recycling the fluid generated by the first fan, converting the fluid into usable energy (such as power supply), and supplying the energy to the reception module for use or storage.

DETAILED DESCRIPTION OF THE INVENTION

Figure 1:
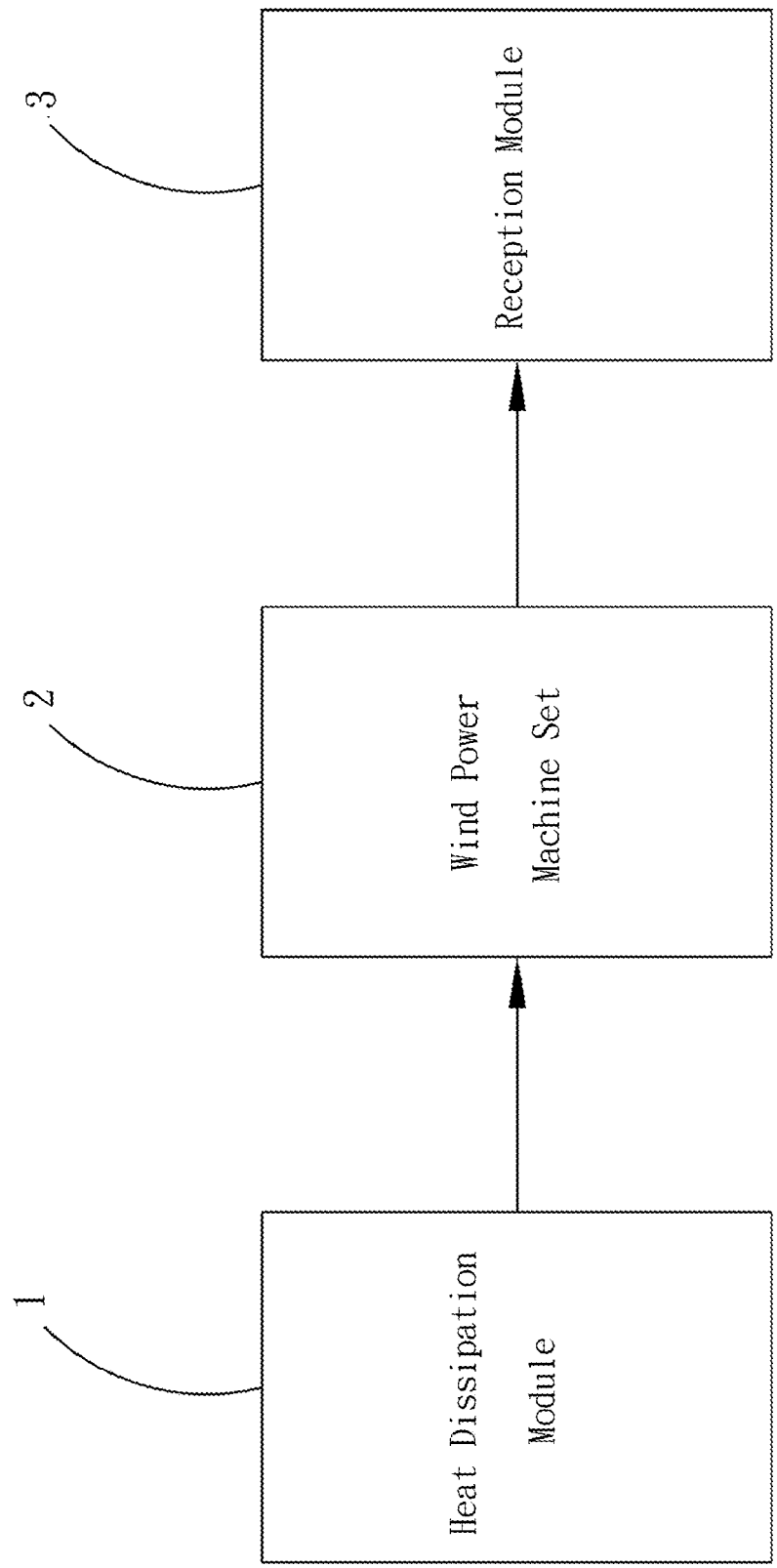
FIG. 1 is a block diagram showing the first preferred embodiment according to the present invention.
Figure 2A:
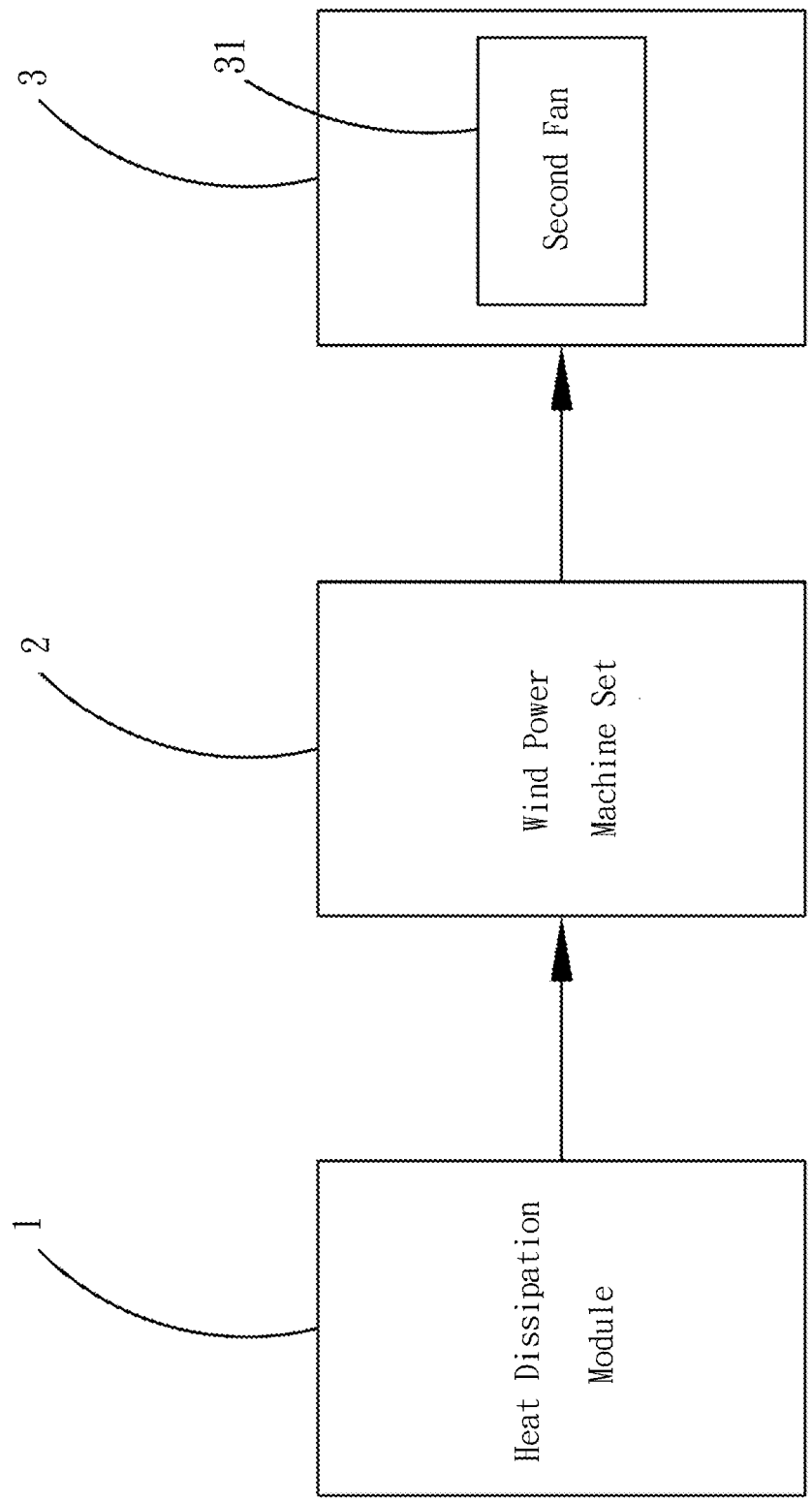
FIG. 2A is a block diagram showing the first mode of the first preferred embodiment according to the present invention
Figure 2B:
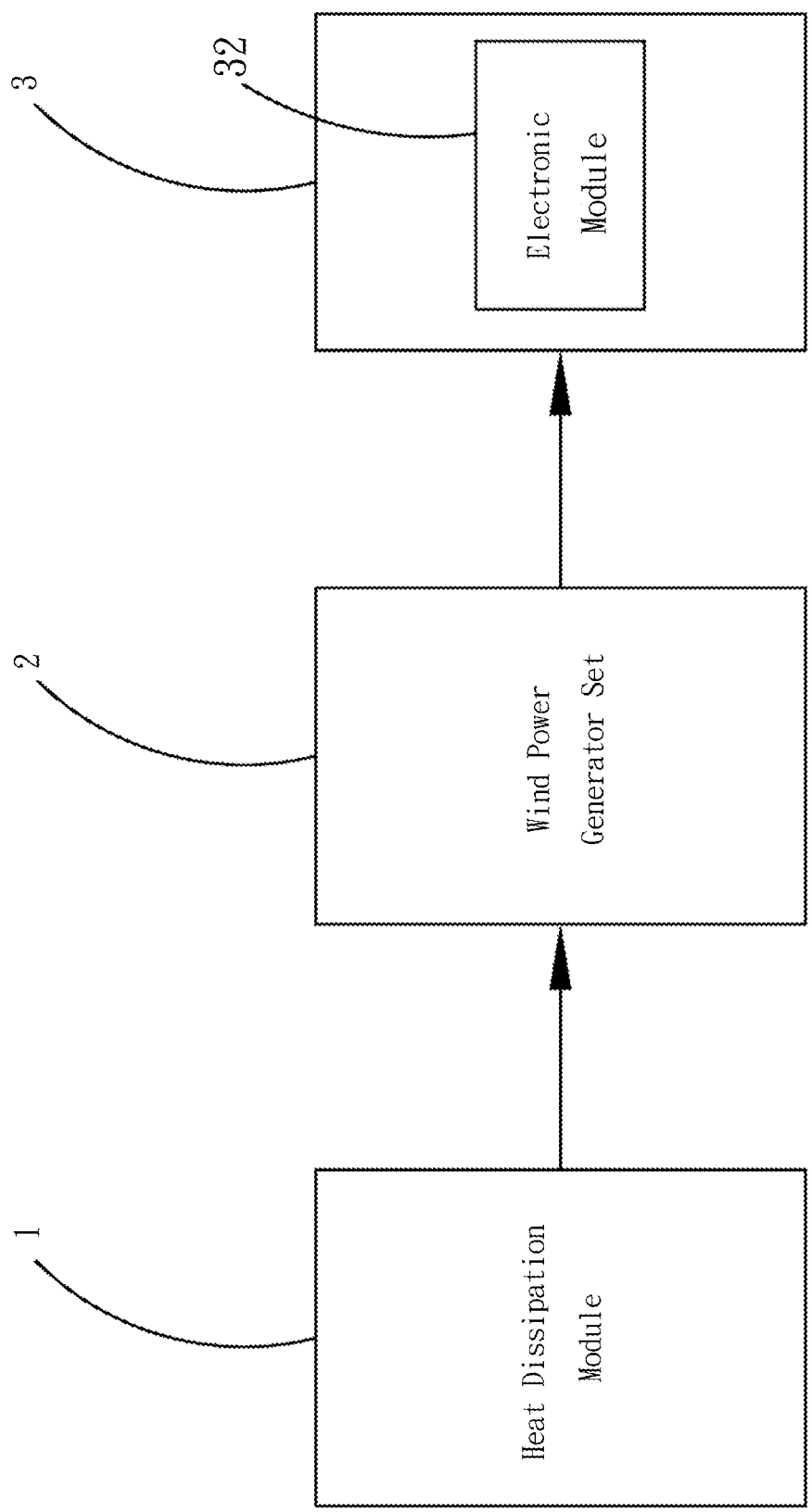
FIG. 2B is a block diagram showing the second mode of the first preferred embodiment according to the present invention.
Figure 2C:
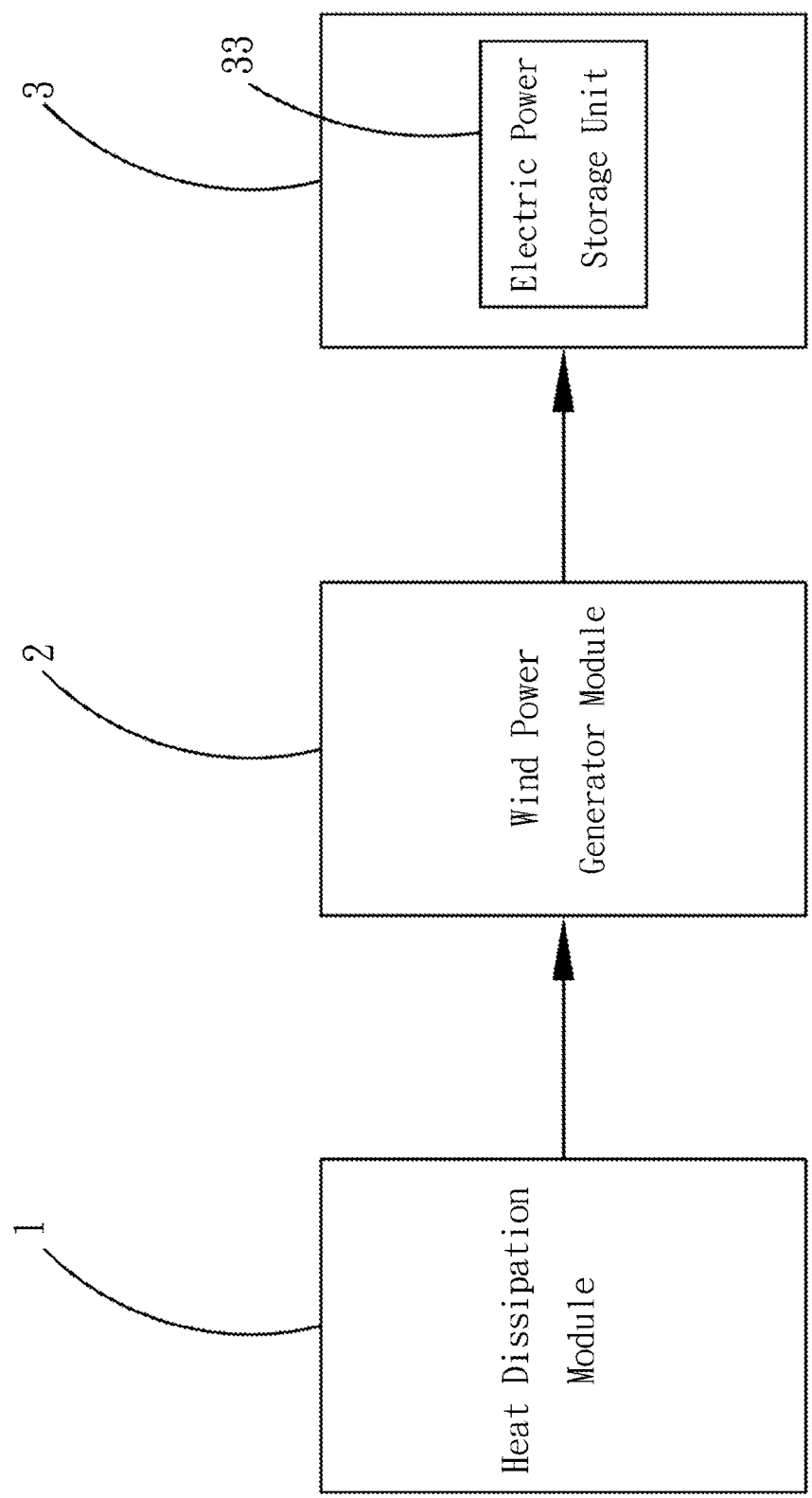
FIG. 2C is a block diagram showing the third mode of the first preferred embodiment according to the present invention.
Figure 2D:
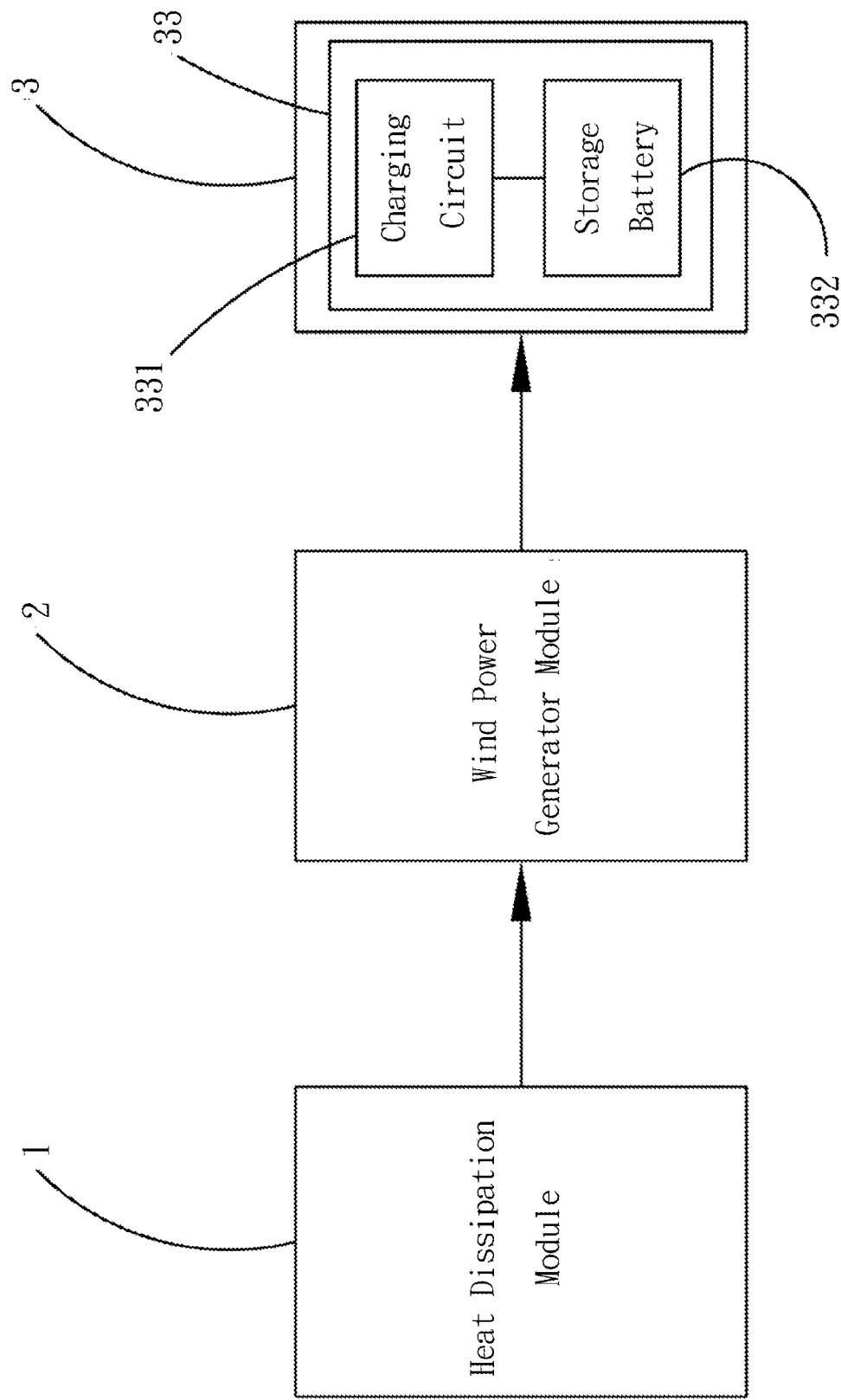
FIG. 2D is another block diagram showing the third mode of the first preferred embodiment according to the present invention.

The technique, device, and effectiveness of the present invention will now be illustrated by way of its preferred embodiment with reference to the accompanying drawings.

Referring now to FIGS. 1, 2A, 2B, 2C, 2D, 3, and 4, the present invention relates to a wind power generation device for electronic equipment. The first preferred embodiment according to the present invention includes at least a heat dissipation module 1, a wind power generation module 2, and at least a reception module 3. The heat dissipation module 1 includes a heat dissipation device 10 with a plurality of heat dissipating fins 101 and a first fan 11 butted to one side of the heat dissipation device 10. The wind power generation module 2 is butted to the other side of the heat dissipation device 10 in opposition to the first fan 11. That is, the first fan 11 and the wind power generation module 2 are fixed on the opposite sides of the heat dissipating fins 101 of the heat dissipation device 10, so that the heat dissipation device 10 is located between the first fan 11 and the wind power generation module 2. Propelled by the fluid generated by the first fan 11, the wind power generation module 2 operates and generates electricity, producing a power signal.

The reception module 3 is electrically interconnected with the wind power generation module 2 and can be in any of the following three modes in the first preferred embodiment according to the present invention:

In the first mode, the reception module 3 is a second fan 31, which is driven by the power signal transmitted by the wind power generation module 2. That is, the wind power generation module 2 is propelled by the fluid generated by the first fan 11 and starts to operate. During the operation a resonant excitation is generated inside the wind power generation module 2 and the power signal is produced, which reaches the second fan 31 and drives it to operate. In this way, extra demand for electricity is reduced and energy is effectively saved (please refer to FIG. 2A).

In the second mode, the reception module 3 is an electronic module 32, such as CD-ROM drive, computer peripheral, or electronic component, etc. The electronic module 32 receives and utilizes the power signal transmitted by the wind power generation module 2 and is driven to operate. That is, the wind power generation module 2 is driven to operate under the propulsion of the fluid generated by the first fan 11. During the operation, a resonant excitation is generated inside the wind power generation module 2 and the power signal is generated. The electronic module 32 receives and utilizes the power signal, achieving the purposed of saving energy (please refer to FIG. 2B).

In the third mode, the reception module 3 is an electric power storage unit 33, which comprises a charging circuit 331 and a storage battery 332. The charging circuit 331 is electrically interconnected with the storage battery 332 and is used to receive and store the power signal transmitted by the wind power generation module 2. That is, after receiving the power signal transmitted by the wind power generation module 2, the electric power storage unit 33 stores the electric energy of the power signal in the storage battery 332 by way of the charging circuit 331 and supplies it to other electronic components or save it as back up power, achieving the purpose of energy saving (please refer to FIGS. 2C and 2D).

The reception module 3 is not limited to the above-mentioned three modes. Any device or component driven by electric power (or power supply) can be disposed in the reception module 3

Figure 3:
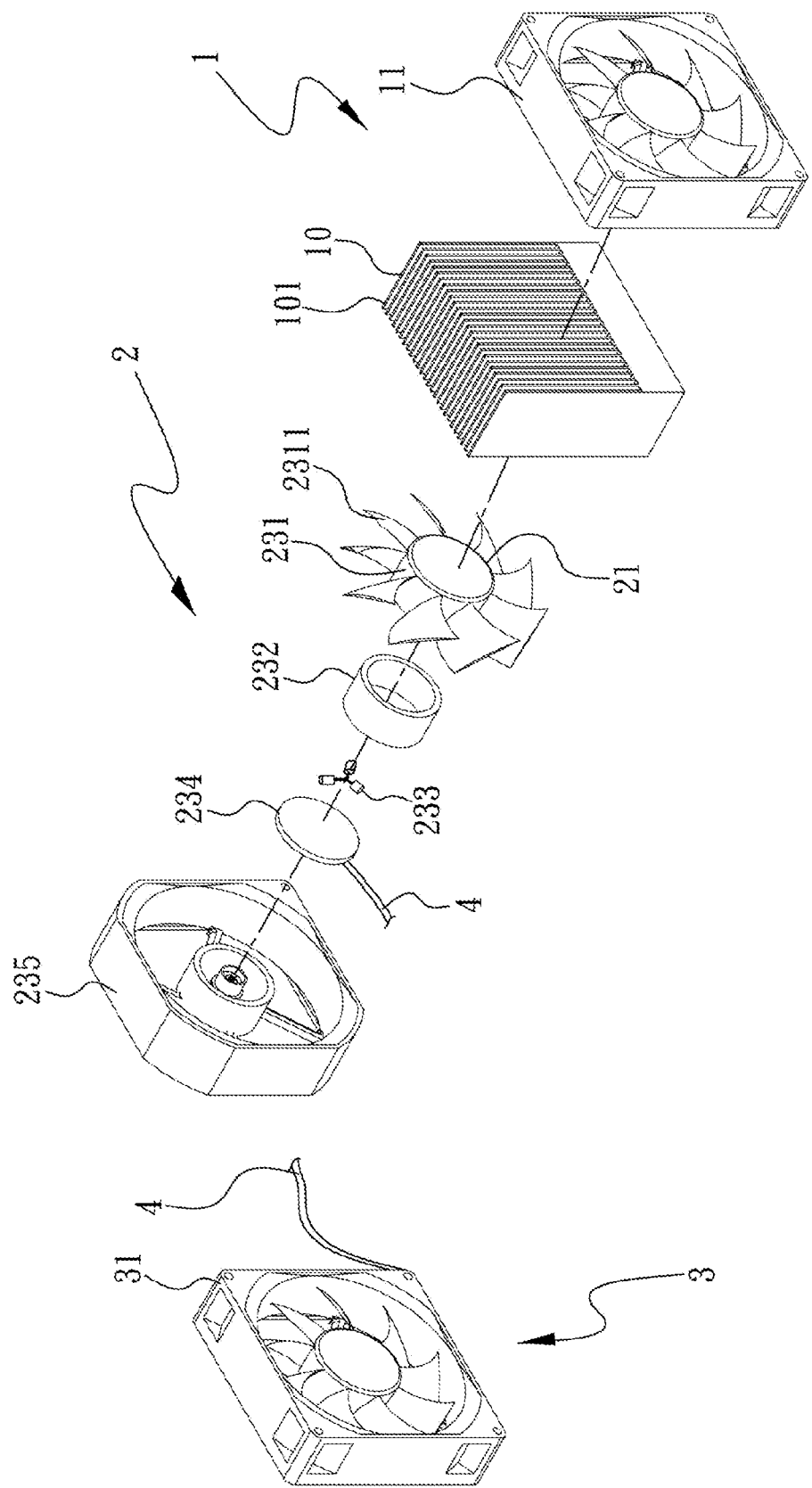
FIG. 3 is an exploded perspective view showing the first preferred embodiment according to the present invention.
Figure 4:
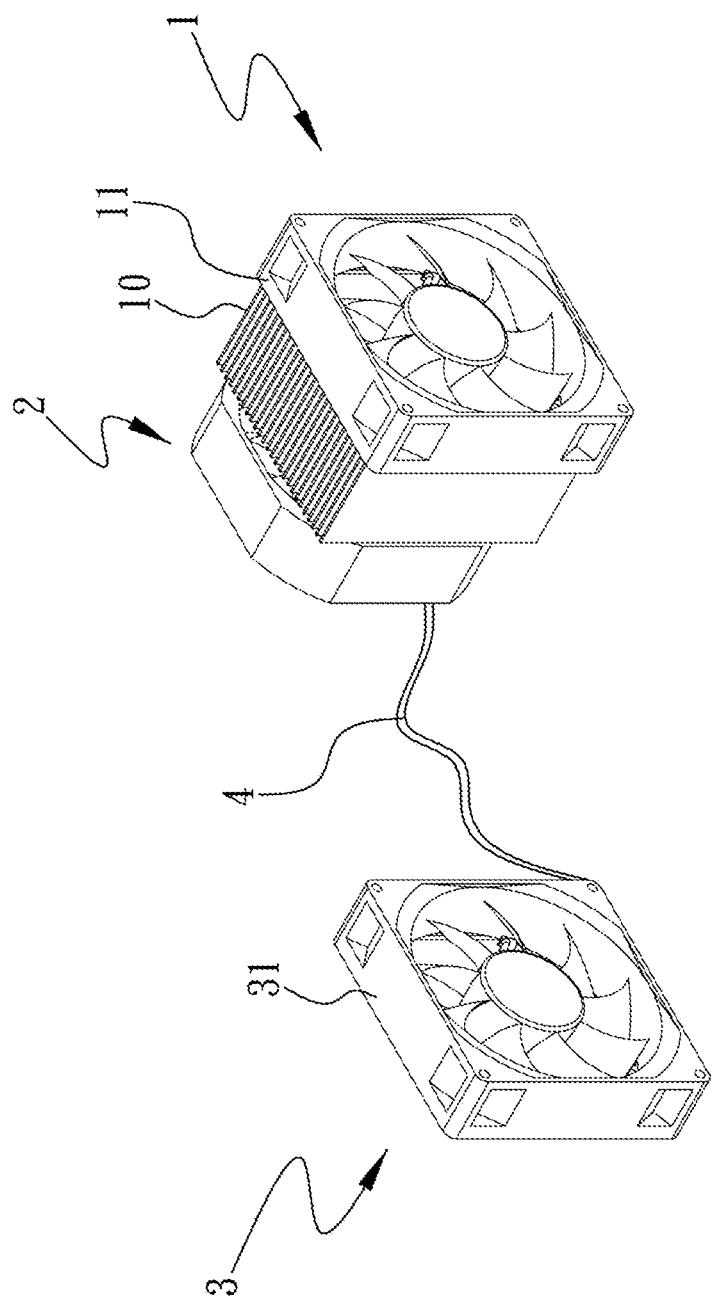
FIG. 4 is an assembled perspective view showing the first preferred embodiment according to the present invention.

Referring now to FIGS. 3 and 4, the wind power generation module 2 includes a fan wheel 21 and a frame 235. The fan wheel 21 comprises a disc hub 231, a magnetic component 232, a coil set 233, and a rectification circuit board 234. The coil set 233 is coupled with the rectification circuit board 234 and is disposed inside the disc hub 231 together with the magnetic component 232. The disc hub 231 includes a plurality of blades 2311 and is disposed inside the frame 235 to form the wind power generation module 2.

In addition, between the wind power generation module 2 and the reception module 3 is disposed a signal transmission line 4, which is electrically interconnected with the rectification circuit board 234 on the one side and the reception module 3 on the other to transmit the power signal.

When the fluid generated by the first fan 11 drives the blades 2311 on the disc hub 231 to turn, the magnetic component 232 will turn along with the disc hub 231. Via the interaction between the magnetic component 232 and the coil set 233, a resonant excitation is generated and induced voltage produced, which is then received and rectified by the rectification circuit board 234 into direct voltage (that is, the above-mentioned power signal) and transmitted to the reception module 3 for use through the signal transmission line 4.

Figure 5:
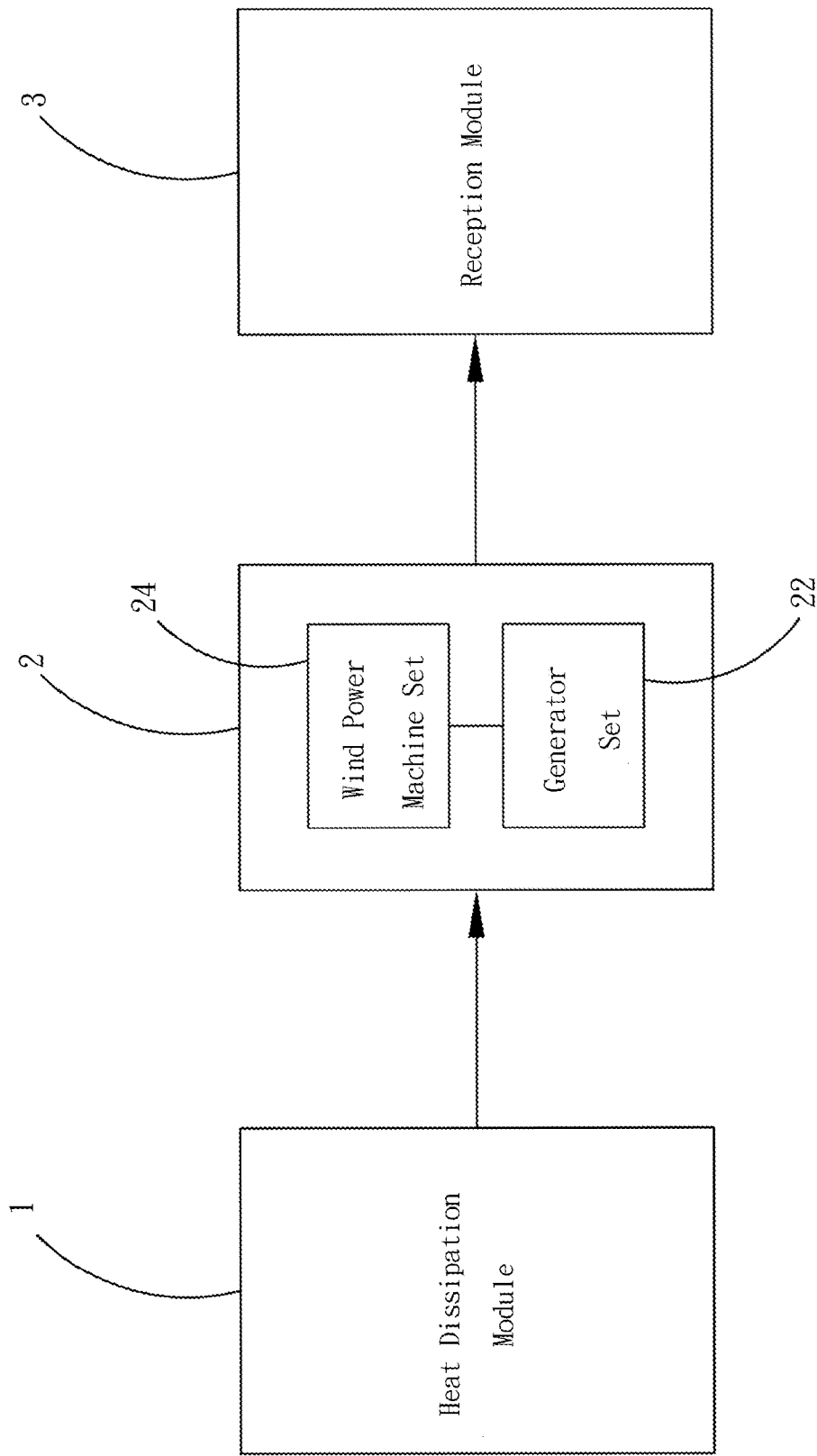
FIG. 5 is a block diagram showing the second and the third preferred embodiments according to the present invention.
Figure 6:
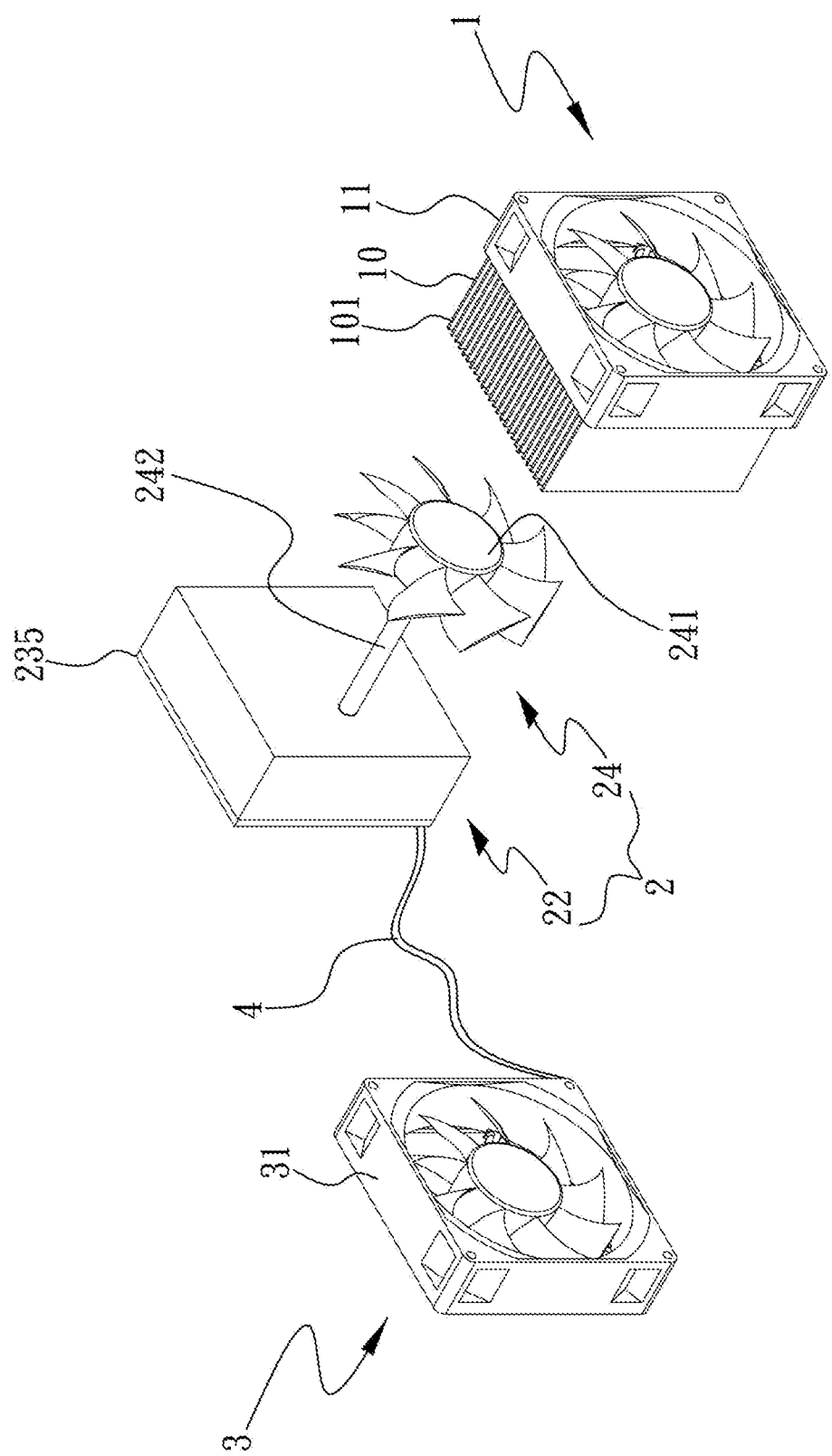
FIG. 6 is a perspective view of the second and the third preferred embodiments according to the present invention.
Figure 7A:
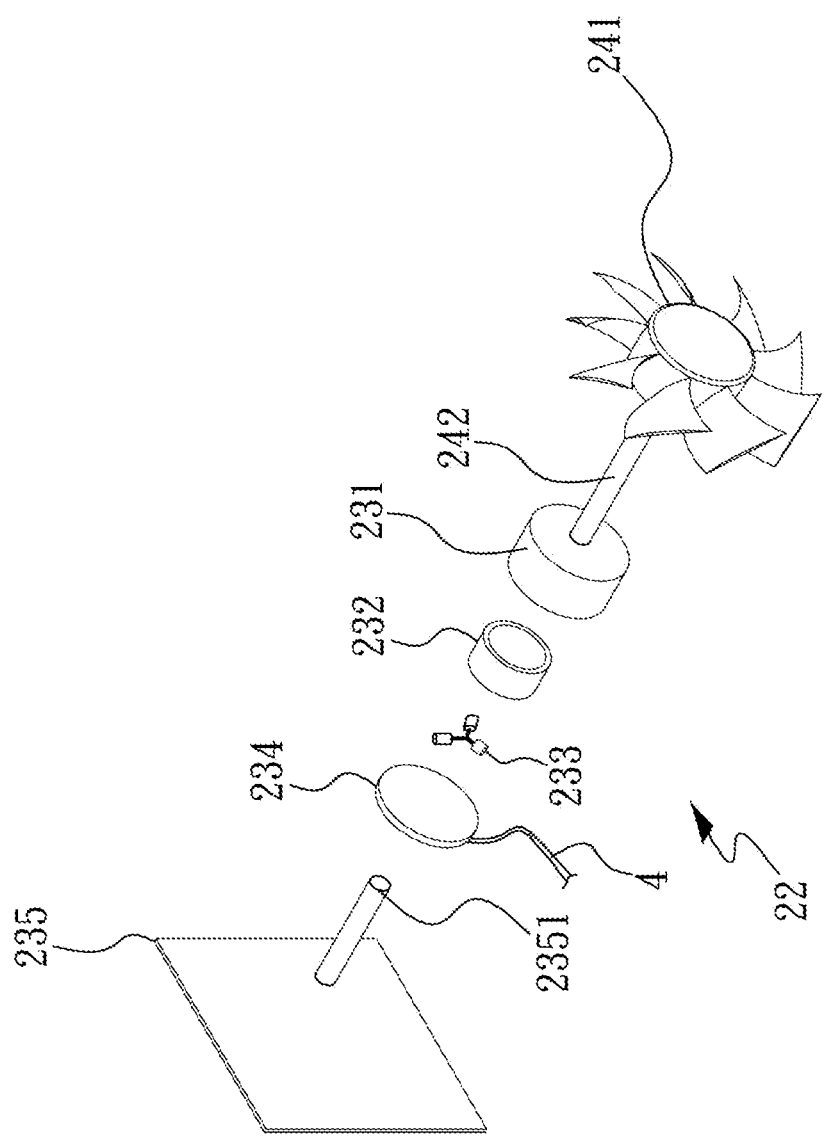
FIG. 7A is an exploded perspective view of the generating unit according to the second preferred embodiment of the present invention.

Referring now to FIGS. 5, 6, and 7A, the second preferred embodiment according to the present invention is similar to the above-mentioned first preferred embodiment except that the wind power generation module 2 of the second preferred embodiment includes a wind power machine set 24 and a generator set 22. The wind power machine set 24 is connected to the generator set 22 and disposed on the other side of the heat dissipation device 10, so that it can be driven to operate and produce the power signal under the propulsion of the fluid generated by the first fan 11.

The wind power machine set 24 includes a fan blade set 241 and a transmission shaft lever 242, which is plugged into the fan blade set 241 on one end and connected with the generator set 22 on the other. The generator set 22 includes a disc hub 231, a magnetic component 232, a coil set 233, a rectification circuit board 234, and a frame 235. The coil set 233 is coupled with the rectification circuit board 234 and disposed inside the disc hub 231 along with the magnetic component 232. Protruding away from the bottom of the frame 235 is disposed a beam barrel 2351, which is pivotally connected with the disc hub 231.

The reception module 3 is electrically interconnected with the generator set 22 to receive the power signal transmitted thereby. The modes of the reception module 3 in the second preferred embodiment are identical with those in the first preferred embodiment and therefore are not described here.

When the fluid generated by the first fan 11 flow to the plurality of blades 2311 on the fan blade set 241 and drive the blades to turn, the transmission shaft lever 242 will turn along with the fan blade set 241 and drive the disc hub 231 of the generator set 22 connected with it to turn as well. Accordingly, the magnetic component 232 inside the disc hub 231 will also turn, interact with the coil set 233, and produce induced voltage through a resonant excitation. The induced voltage is received and rectified into direct voltage (that is, the above-mentioned power signal) by the rectification circuit board 234 and transmitted by the signal transmission line 4 to the reception module 3 for use, achieving the purpose of energy saving.

Figure 7B:
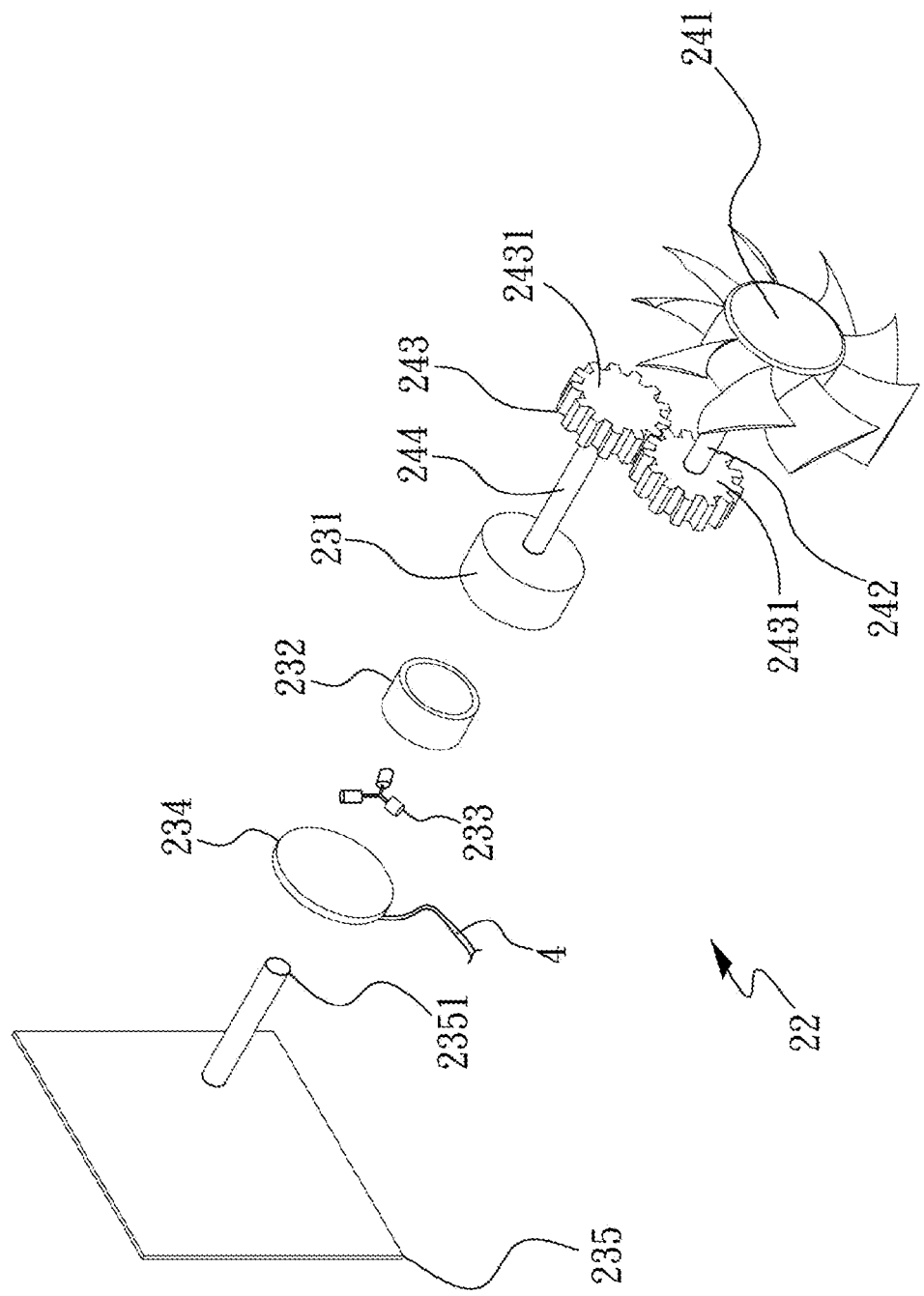
FIG. 7B is an exploded perspective view of the generating unit according to the third preferred embodiment of the present invention.

Referring now to FIGS. 5, 6, and 7B, the third preferred embodiment according to the present invention is similar to the above-mentioned second preferred embodiment except that the wind power machine set 24 includes also a transmission assembly 243 and a connecting lever 244. The connecting lever 244 is connected with the disc hub 231 of the generator set 22 on one end and fixed to the transmission assembly 243 on the other. The other end of the transmission shaft lever 242 is fixed to the other end of the transmission assembly 243.

The transmission assembly 243 can either be a gear, a belt, a chain, or a transmission shaft. In the third preferred embodiment, the transmission assembly 243 is illustrated with two gears 2431, wherein the first gear 2431 and the second gear 2431 are tightly meshed with each other. The first gear 2431, which faces the end surface of the disc hub 231 is fixed with the other end of the connecting lever 244, while the second gear 2431 which faces the end surface of the fan blade set 241 is connected with the other end of the transmission shaft lever 242.

The combination of the heat dissipation module 1, the wind power generation module 2, and the reception module 3 in the present invention effectively utilizes or recycles the fluid generated by the first fan 11 to supply power to the reception module 3 for use or storage, achieving the purpose of energy saving.

In view of the foregoing considerations, the present invention is a wind power generation device for electronic equipment having the following advantages:

1. It can effectively save energy.
2. It can effectively utilize or recycle the fluid generated by the first fan and convert it into usable energy (such as power supply).

While the invention has been described with reference to the preferred embodiments thereof, it is to be understood that modifications or variations may be easily made without departing from the spirit of this invention, which is defined in the appended claims.

What is claimed is:

1. A wind power generation device for electronic equipment, comprising:
   at least a heat dissipation module having a heat dissipation device with a plurality of heat dissipation fins and a first fan abutting a side of the heat dissipation device;
   a wind power generation module abutting the other side of the heat dissipation device in opposition to the first fan, which operates to generate electricity and produces a power signal under propulsion of the fluid flow generated by the first fan; and
   at least a reception module electrically connected with the wind power generation module to receive the power signal transmitted thereby.

2. The wind power generation device for electronic equipment as defined in claim 1, wherein the wind power generation module includes a frame and a fan wheel having a disc hub, a magnetic component, a coil set, and a rectification circuit board; wherein the coil set is coupled to the rectification circuit board and disposed along with the magnetic component inside the disc hub with a plurality of blades; and wherein the fan wheel is disposed inside the frame.

3. The wind power generation device for electronic equipment as defined in claim 2, wherein between the wind power generation module and the reception module is disposed a signal transmission line, which is electrically connected to the rectification circuit board on one end and the reception module on the other to transmit the power signal.

4. The wind power generation device for electronic equipment as defined in claim 1, wherein the reception module is a second fan, which is driven to operate by receiving and utilizing the power signal transmitted by the wind power generation module.

5. The wind power generation device for electronic equipment as defined in claim 1, wherein the reception module is an electronic module, which is driven to operate by receiving and utilizing the power signal transmitted by the wind power generation module.

6. The wind power generation device for electronic equipment as defined in claim 1, wherein the reception module is an electric power storage unit having a charging circuit and a storage battery, which are electrically connected to each other and which are used to receive and store the power signal transmitted by the wind power generation module.

7. A wind power generation device for electronic equipment, comprising:
   at least a heat dissipation module having a heat dissipation device with a plurality of heat dissipation fins and a first fan abutting a side of the heat dissipation device;
   a wind power generation module having a wind power machine set and a generator set, wherein the wind power machine set is connected to the generator set and disposed on the other side of the heat dissipation device to operate, generate electricity, and produce a power signal under the propulsion of the fluid generated by the first fan; and
   at least a reception module, which is electrically connected to the generator set to receive the power signal transmitted thereby.

8. The wind power generation device for electronic equipment as defined in claim 7, wherein the wind power machine set includes a fan blade set and a transmission shaft lever, which is plugged into the fan blade set on an end.

9. The wind power generation device for electronic equipment as defined in claim 8, wherein the wind power machine set further includes a transmission assembly and a connecting lever, which is connected to the generator set on an end and fixed to an end of the transmission assembly on another end; and wherein the other end of the transmission shaft lever is fixed to another end of the transmission assembly.

10. The wind power generation device for electronic equipment as defined in claim 9, wherein the transmission assembly is a gear, a belt, a chain, or a transmission shaft.

11. A wind power generation device for electronic equipment as defined in claim 8, wherein the generator set includes a disc hub, a magnetic component, a coil set, a rectification circuit board, and a frame; wherein the coil set is coupled to the rectification circuit board and disposed inside the disc hub along with the magnetic component; and wherein a beam barrel protrudes from the frame and is pivotally connected to the disc hub.

12. A wind power generation device for electronic equipment as defined in claim 9, wherein the generator set includes a disc hub, a magnetic component, a coil set, a rectification circuit board, and a frame; wherein the coil set is coupled to the rectification circuit board and disposed inside the disc hub along with the magnetic component; and wherein a beam barrel protrudes from the frame and is pivotally connected to the disc hub.

13. The wind power generation device for electronic equipment as defined in claim 11, wherein between the wind power generation module and the reception module is disposed a signal transmission line, which is electrically connected to the rectification circuit board on an end and the reception module on another end to transmit the power signal.

14. The wind power generation device for electronic equipment as defined in claim 12, wherein between the wind power generation module and the reception module is disposed a signal transmission line, which is electrically connected to the rectification circuit board on an end and the reception module on another end to transmit the power signal.

15. The wind power generation device for electronic equipment as defined in claim 7, wherein the reception module is a second fan, which is driven to operate by receiving and utilizing the power signal transmitted by the wind power generation module.

16. The wind power generation device for electronic equipment as defined in claim 7, wherein the reception module is an electronic module, which is driven to operate by receiving and utilizing the power signal transmitted by the wind power generation module.

17. The wind power generation device for electronic equipment as defined in claim 7, wherein the reception module is an electric power storage unit having a charging circuit and a storage battery, which are electrically connected to each other and which are used to receive and store the power signal transmitted by the wind power generation module.

\* \* \* \* \*